(12) United States Patent
Disney (10) Patent No.: US 9,257,500 B2
(45) Date of Patent: Feb. 9, 2016

(54) VERTICAL GALLIUM NITRIDE POWER DEVICE WITH BREAKDOWN VOLTAGE CONTROL

(71) Applicant: Avogy, Inc., San Jose, CA (US)

(72) Inventor: Donald R. Disney, San Jose, CA (US)

(73) Assignee: Avogy, Inc., San Jose, CA (US)

( * ) Notice: Subject to any disclaimer, the term of this patent is extended or adjusted under 35 U.S.C. 154(b) by 0 days.

(21) Appl. No.: 14/517,564

(22) Filed: Oct. 17, 2014

(65) Prior Publication Data

US 2015/0104912 A1   Apr. 16, 2015

Related U.S. Application Data

(62) Division of application No. 13/721,542, filed on Dec. 20, 2012, now Pat. No. 8,866,148.

(51) Int. Cl.
| | |
|---|---|
| H01L 21/265 | (2006.01) |
| H01L 29/06 | (2006.01) |
| H01L 29/66 | (2006.01) |
| H01L 29/32 | (2006.01) |
| H01L 29/36 | (2006.01) |
| H01L 29/808 | (2006.01) |
| H01L 29/861 | (2006.01) |
| H01L 29/872 | (2006.01) |
| H01L 29/20 | (2006.01) |
| H01L 29/207 | (2006.01) |

(52) U.S. Cl.
CPC ...... *H01L 29/0619* (2013.01); *H01L 21/26546* (2013.01); *H01L 29/0615* (2013.01); *H01L 29/0626* (2013.01); *H01L 29/32* (2013.01); *H01L 29/36* (2013.01); *H01L 29/66143* (2013.01); *H01L 29/66212* (2013.01); *H01L 29/66909* (2013.01); *H01L 29/66924* (2013.01); *H01L 29/8083* (2013.01); *H01L 29/8613* (2013.01); *H01L 29/872* (2013.01); *H01L 29/2003* (2013.01); *H01L 29/207* (2013.01)

(58) Field of Classification Search
None
See application file for complete search history.

(56) References Cited

U.S. PATENT DOCUMENTS

| | | | |
|---|---|---|---|
| 5,218,226 | A | 6/1993 | Slatter et al. |
| 7,553,747 | B2 | 6/2009 | Hirose et al. |
| 8,174,089 | B2 | 5/2012 | Flynn et al. |
| 8,178,949 | B2 | 5/2012 | Ishii et al. |
| 8,188,514 | B2 * | 5/2012 | Sugimoto ........... H01L 29/0642 257/12 |
| 8,519,438 | B2 | 8/2013 | Mishra et al. |

(Continued)

OTHER PUBLICATIONS

Non-Final Office Action for U.S. Appl. No. 13/721,542 mailed on Jan. 28, 2014, 18 pages.

(Continued)

*Primary Examiner* — Benjamin Sandvik
*Assistant Examiner* — Herve Assouman
(74) *Attorney, Agent, or Firm* — Kilpatrick Townsend & Stockton LLP (57) ABSTRACT

A method for fabricating a vertical GaN power device includes providing a first GaN material having a first conductivity type and forming a second GaN material having a second conductivity type and coupled to the first GaN material to create a junction. The method further includes implanting ions through the second GaN material and into a first portion of the first GaN material to increase a doping concentration of the first conductivity type. The first portion of the junction is characterized by a reduced breakdown voltage relative to a breakdown voltage of a second portion of the junction.

14 Claims, 10 Drawing Sheets

(56) References Cited

U.S. PATENT DOCUMENTS

| | | |
|---|---|---|
| 8,716,716 B2 | 5/2014 | Nie et al. |
| 8,749,015 B2 | 6/2014 | Disney et al. |
| 8,866,148 B2 | 10/2014 | Disney et al. |
| 8,927,999 B2 | 1/2015 | Kizilyalli et al. |
| 8,969,926 B2 | 3/2015 | Disney |
| 2009/0057717 A1* | 3/2009 | Rodrigues ........... H01L 27/0262 257/173 |
| 2013/0032814 A1 | 2/2013 | Bour et al. |
| 2013/0062723 A1 | 3/2013 | Henning et al. |
| 2013/0087835 A1 | 4/2013 | Edwards et al. |
| 2013/0126888 A1 | 5/2013 | Kizilyalli et al. |
| 2013/0161633 A1* | 6/2013 | Nie ................... H01L 29/66204 257/76 |

OTHER PUBLICATIONS

Notice of Allowance for U.S. Appl. No. 13/721,542 mailed on Jul. 10, 2014, 9 pages.

* cited by examiner

VERTICAL GALLIUM NITRIDE POWER DEVICE WITH BREAKDOWN VOLTAGE CONTROL

CROSS-REFERENCES TO RELATED APPLICATIONS

This application is a division of U.S. patent application Ser.No. 13/721,542, filed on Dec. 20, 2012, now U.S. Pat. No. 8,866,148, the disclosure of which is incorporated by reference herein in its entirety for all purposes.

BACKGROUND OF THE INVENTION

Power electronics are widely used in a variety of applications. Power electronic devices are commonly used in circuits to modify the form of electrical energy, for example, from ac to dc, from one voltage level to another, or in some other way. Such devices can operate over a wide range of power levels, from milliwatts in mobile devices to hundreds of megawatts in a high voltage power transmission system. Despite the progress made in power electronics, there is a need in the art for improved electronics systems and methods of operating the same.

SUMMARY OF THE INVENTION

The present invention relates generally to electronic devices. More specifically, the present invention relates to fabricating vertical gallium-nitride (GaN) power devices with one or more controlled breakdown regions configured to help determine where the breakdown current flows in the vertical GaN power devices. Merely by way of example, the invention has been applied to methods and systems for manufacturing vertical diodes, including Schottky barrier diodes, as well as junction field-effect transistors (JFETs). In fact, the methods and techniques can be applied to a variety of semiconductor devices utilizing a p-n junction, or the like.

An example method for fabricating a vertical GaN power device, according to the disclosure, can include providing a first GaN material having a first conductivity type and forming a second GaN material having a second conductivity type and coupled to the first GaN material to create a junction. The method further includes implanting ions through the second GaN material and into a first portion of the first GaN material to increase a doping concentration of the first conductivity type. The first portion of the junction is characterized by a reduced breakdown voltage relative to a breakdown voltage of a second portion of the junction.

An example vertical GaN power device, according to the disclosure, can include a first GaN material having a first conductivity type and a second GaN material having a second conductivity type and coupled to the first GaN material to form a junction. A first portion of the junction can include an implanted region of the first conductivity type, the implanted region can have a dopant density higher than a dopant density of the first GaN material, and the first portion of the junction can be characterized by a reduced breakdown voltage relative to a breakdown voltage of a second portion of the junction.

An example vertical III-nitride power device, according to the disclosure, can include a junction formed by a first GaN material of a first conductivity type coupled to a second GaN material of a second conductivity type. The junction can further include a device region and a controlled breakdown region within the device region. The junction in the controlled breakdown region can be characterized by having a lower breakdown voltage than at least a portion of the device region outside of the controlled breakdown region.

Numerous benefits are achieved by way of the present invention over conventional techniques. For example, the controlled breakdown region can include characteristics (size, location, etc.) to reduce or eliminate breakdown current at the edges of the vertical GaN power device. The controlled current flow provided by the controlled breakdown region can thereby reduce heating of the device and any deterioration in performance resulting therefrom. These and other embodiments of the invention, along with many of its advantages and features, are described in more detail in conjunction with the text below and attached figures.

BRIEF DESCRIPTION OF THE DRAWINGS

FIGS. 2E-1 and 2E-2 illustrate embodiments of edge termination structures that may be used in conjunction with the vertical GaN diode of FIGS. 2A-2D;

In the appended figures, similar components and/or features may have the same reference label. Further, various components of the same type may be distinguished by following the reference label by a dash and a second label that distinguishes among the similar components. If only the first reference label is used in the specification, the description is applicable to any one of the similar components having the same first reference label irrespective of the second reference label.

DETAILED DESCRIPTION OF SPECIFIC EMBODIMENTS

The present invention relates generally to electronic devices. More specifically, the present invention relates to providing a voltage breakdown control to help ensure controlled breakdown of a p-n junction in a vertical gallium-nitride (GaN) device. This can, for instance, help ensure that a device region of a vertical GaN device breaks down at a controlled region within a portion of the device region, rather than at the edges of the device region. Merely by way of example, the invention has been applied to techniques for manufacturing vertical diodes, including Schottky barrier diodes. The methods and techniques can also be applied to junction field-effect transistors (JFETs) and other semiconductor devices utilizing p-n junctions.

GaN-based electronic and optoelectronic devices are undergoing rapid development. Desirable properties associated with GaN and related alloys and heterostructures include high bandgap energy for visible and ultraviolet light emission, favorable transport properties (e.g., high electron mobility and saturation velocity), a high breakdown field, and high thermal conductivity. According to embodiments of the present invention, gallium nitride (GaN) epitaxy on pseudo-bulk GaN substrates is utilized to fabricate vertical GaN-based semiconductor devices not possible using conventional techniques. For example, conventional methods of growing GaN include using a foreign substrate such as silicon carbide (SiC). This can limit the thickness of a usable GaN layer grown on the foreign substrate due to differences in thermal expansion coefficients and lattice constant between the GaN layer and the foreign substrate. High defect densities at the interface between GaN and the foreign substrate further complicate attempts to create vertical devices, including power electronic devices such as JFETs and other field-effect transistors.

Homoepitaxial GaN layers on bulk GaN substrates, on the other hand, are utilized in the embodiments described herein to provide superior properties to conventional techniques and devices. For instance, electron mobility, $\mu$, is higher for a given background doping level, N. This provides low resistivity, p, because resistivity is inversely proportional to electron mobility, as provided by equation (1):

$$\rho = \frac{1}{q\mu N}, \qquad (1)$$

where q is the elementary charge.

Another superior property provided by homoepitaxial GaN layers on bulk GaN substrates is high critical electric field for avalanche breakdown. A high critical electric field allows a larger voltage to be supported over smaller length, L, than a material with a lower critical electric field. A smaller length for current to flow together with low resistivity give rise to a lower resistance, R, than other materials, since resistance can be determined by the equation:

$$R = \frac{\rho L}{A}, \qquad (2)$$

where A is the cross-sectional area of the channel or current path.

In general, a tradeoff exists between the physical dimension of a device needed to support high voltage in a device's off-state and the ability to pass current through the same device with low resistance in the on-state. In many cases GaN is preferable over other materials in minimizing this tradeoff and maximizing performance. In addition, GaN layers grown on bulk GaN substrates have low defect density compared to layers grown on mismatched substrates. The low defect density will give rise to superior thermal conductivity, less trap-related effects such as dynamic on-resistance, and better reliability.

According to embodiments of the present invention, gallium nitride (GaN) epitaxy on pseudo-bulk GaN substrates can be utilized to fabricate edge semiconductor devices and/or edge termination structures not possible using conventional techniques. For example, conventional methods of growing GaN include using a foreign substrate such as silicon carbide (SiC). This can limit the thickness of a usable GaN layer grown on the foreign substrate due to differences in thermal expansion coefficients and lattice constant between the GaN layer and the foreign substrate. High defect densities at the interface between GaN and the foreign substrate further complicate attempts to create edge termination structures for various types of semiconductor devices.

Semiconductor devices utilizing edge termination structures are able to exploit the high critical electric field provided by GaN and related alloys and heterostructures. Edge termination techniques such as field plates, guard rings, and other structures located at and/or near an edge of a p-n junction provide proper edge termination by alleviating high fields at the edge of the semiconductor device. When properly employed, edge termination can help a semiconductor device to break down more uniformly at its main junction rather than uncontrollably at its edge.

Despite edge termination techniques, however, field crowding can still occur at the edge of a device such that breakdown occurs at the edge of the device at a voltage lower than the ideal parallel plane breakdown voltage. Breakdown at the edge of the device can limit the area through which current flows, heating up the device. Techniques disclosed herein employ a controlled breakdown region, which can help ensure avalanche breakdown occurs at the main junction of the device, additionally or alternatively to avalanche breakdown at the edge of the device. This can help ensure the overall break down of the semiconductor device occurs even more uniformly than with edge termination structures alone. That said, techniques disclosed herein do not necessarily need to be used in conjunction with edge termination structures.

Figure 1A:
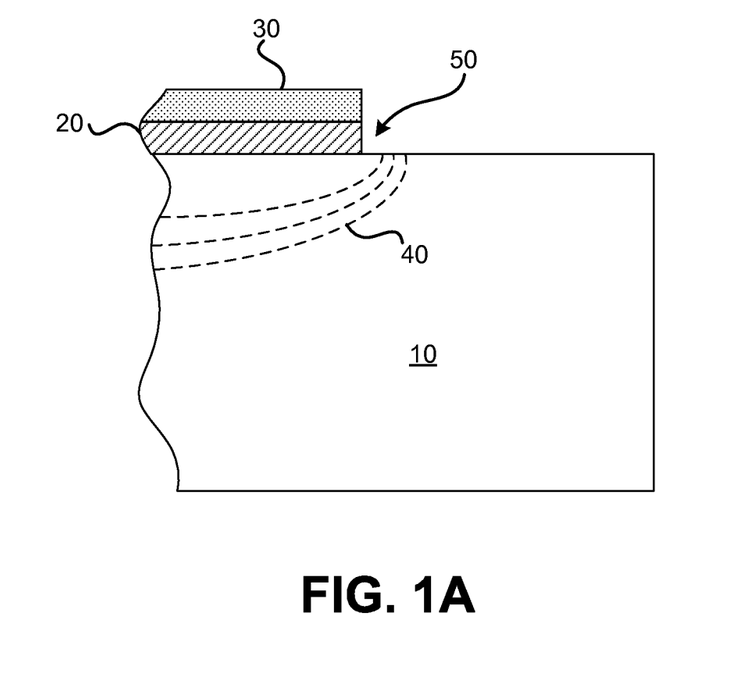
FIGS. 1A-1B are simplified cross-sectional diagrams illustrating a semiconductor device, according to one embodiment.
Figure 1B:
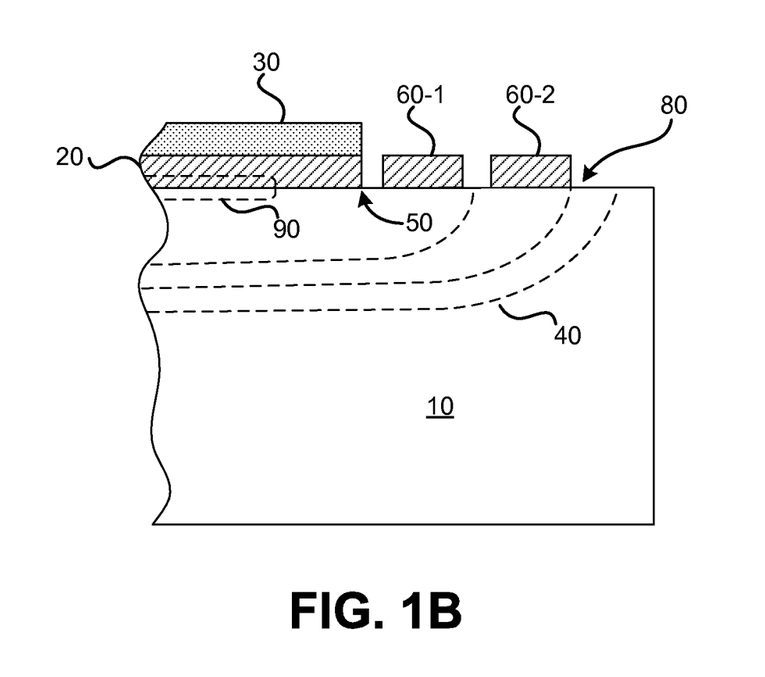

FIGS. 1A-1B are simplified cross-sectional diagrams of a portion of a semiconductor device, according to one embodiment, illustrating how a controlled breakdown region provided herein (which can be used with edge termination structures) can be used to improve the semiconductor device's performance using edge termination. FIG. 1A illustrates a diode structure where a p-n junction is formed by coupling a p-type semiconductor layer 20 on an n-type semiconductor substrate 10, which can be an epitaxial layer. In this example, a metal layer 30 is also formed on the p-type semiconductor layer 20 to provide electrical connectivity to the diode. Metal layer 30 may or may not share the same edge as layer 20 in FIG. 1A and FIG. 1B.

Because the diode of FIG. 1A has no termination structures, its performance is reduced. The electric field 40 (represented in FIG. 1A as potential lines), is crowded near the edge 50 of the diode, causing breakdown at a voltage that can be much less than the parallel plane breakdown voltage for the diode. This phenomenon can be especially detrimental to the operation of high-voltage semiconductor devices.

FIG. 1B illustrates how edge termination structures 60 can be used to alleviate field crowding near the edge 50 of the diode. The edge termination structures 60, which can be made of the same p-type semiconductor material as the p-type semiconductor layer 20 of the diode, are placed near the diode and given voltages such that the electric field 40 extends laterally beyond the edge 50 of the diode. For instance, voltages can be reduced for each edge termination structure 60 as distance from the edge 50 of the diode increases (e.g., a voltage on a closer edge termination structure 60-1 is higher than a voltage on a farther termination structure 60-2), ensuring an outermost edge 80 of an outermost edge termination structure 60-2 has sufficiently low voltage such that the electric field at its edge is lower than the peak field at the semiconductor's main junction can help ensure the semiconductor device operates more closely to its parallel plane breakdown voltage.

The use of edge termination structures, however, typically cannot enable the semiconductor device to operate 100% of its parallel plane breakdown voltage. Furthermore, the device will continue to break down at its edges, resulting in the breakdown current flowing through only a small portion of the p-n junction near the p-n junction's periphery. This breakdown current flow through a relatively limited area can heat up the semiconductor device, which can damage, degrade, or even destroy the semiconductor device. At a minimum, the current flow at the edges of the semiconductor device can limit the amount of current flow the device is capable of conducting.

Techniques provided herein utilize a controlled breakdown region 90 to help spread the breakdown into the main device junction. The controlled breakdown region 90 can comprise a specially-doped area of the main device junction having a breakdown voltage lower than other portions of the main device junction to help ensure the breakdown at the controlled breakdown region 90 occurs at or before breakdown at the edges of the semiconductor device. This allows breakdown current to flow through the main device junction.

FIGS. 2A-2D are simplified cross-sectional diagrams illustrating a process for creating a vertical GaN diode with a controlled breakdown region, according to one embodiment. Referring to FIG. 1, a first GaN layer 210 is formed on a GaN substrate 200. As indicated above, the GaN substrate 200 can be a pseudo-bulk GaN material on which the first GaN layer 210 is grown. Dopant concentrations (e.g., doping density) of the GaN substrate 200 can vary. For example, a GaN substrate 200 can have an n+ conductivity type, with dopant concentrations ranging from $1 \times 10^{17}$ cm$^{-3}$ to $1 \times 10^{19}$ cm$^{-3}$. Although the GaN substrate 200 is illustrated as including a single material composition, multiple layers can be provided as part of the substrate. Moreover, adhesion, buffer, and other layers (not illustrated) can be utilized during the epitaxial growth process. One of ordinary skill in the art would recognize many variations, modifications, and alternatives.

Figure 2A:
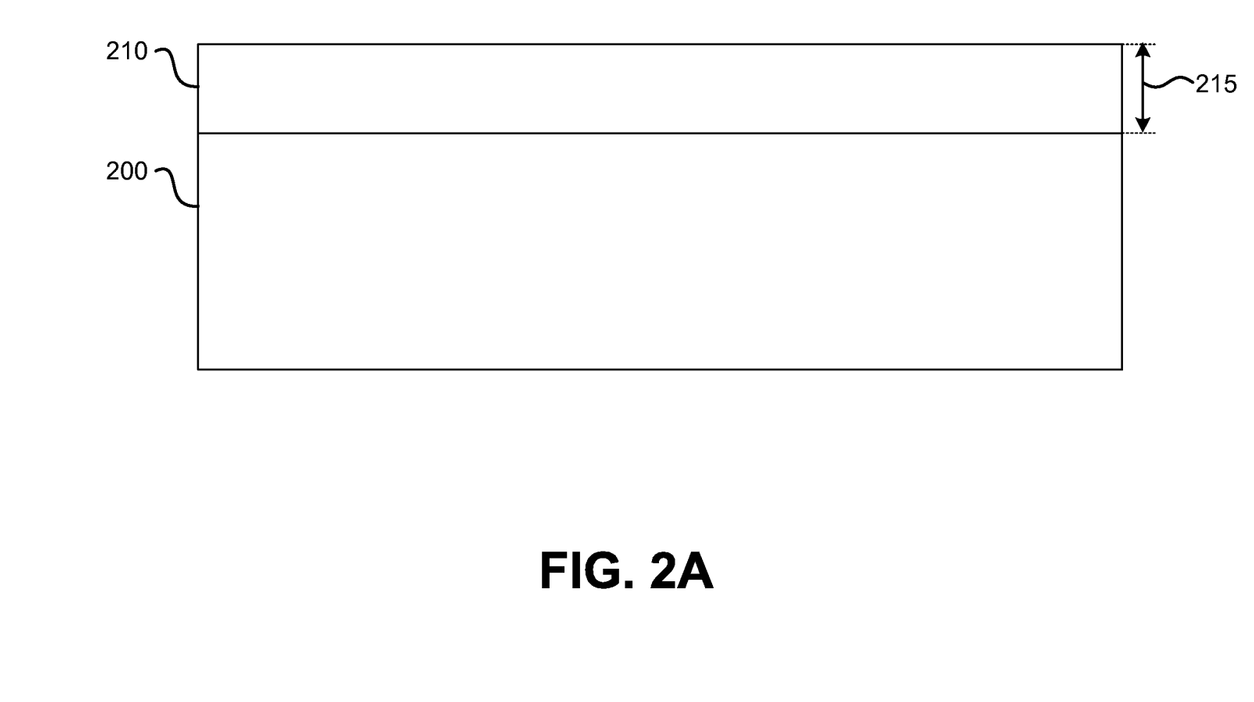
FIGS. 2A-2D are simplified cross-sectional diagrams illustrating a process for creating a vertical GaN diode with a controlled breakdown region, according to one embodiment.

The properties of the first GaN layer 210 can also vary, depending on desired functionality. The first GaN layer 210 can serve as a drift region for the vertical GaN diode, and therefore can be a relatively low-doped material. In some embodiments, the dopant concentration of the first GaN layer 210 is lower than the dopant concentration of the GaN substrate 200. For example, the first GaN layer 210 can have an n− conductivity type, with dopant concentrations between about $1 \times 10^{14}$ cm$^3$ to $1 \times 10^{18}$ cm$^{-3}$. Furthermore, the dopant concentration can be uniform, or can vary, for example, as a function of the thickness of the drift region. In some embodiments, the first GaN layer 210 can comprise two or more sublayers, which can have differing physical characteristics (e.g., dopant concentrations, dopant uniformity, etc.).

The thickness 215 of the first GaN layer 210 can also vary substantially, depending on the desired functionality. As discussed above, homoepitaxial growth can enable the first GaN layer 210 to be grown far thicker than layers formed using conventional methods. In general, in some embodiments, the thickness 215 can be between 0.5 µm and 100 µm, for example. In other embodiments thicknesses 215 are greater than 5 µm. Resulting breakdown voltages for the vertical GaN diode, after applying the techniques disclosed herein, can vary depending on the embodiment. Some embodiments provide for breakdown voltages of at least 100V, 300V, 600V, 1.2 kV, 1.7 kV, 3.3 kV, 5.5 kV, 13 kV, or 20 kV.

Different dopants can be used to create n- and p-type GaN layers and structures disclosed herein. For example, n-type dopants can include silicon, germanium, oxygen, or the like. P-type dopants can include magnesium, beryllium, zinc, or the like.

Figure 2B:
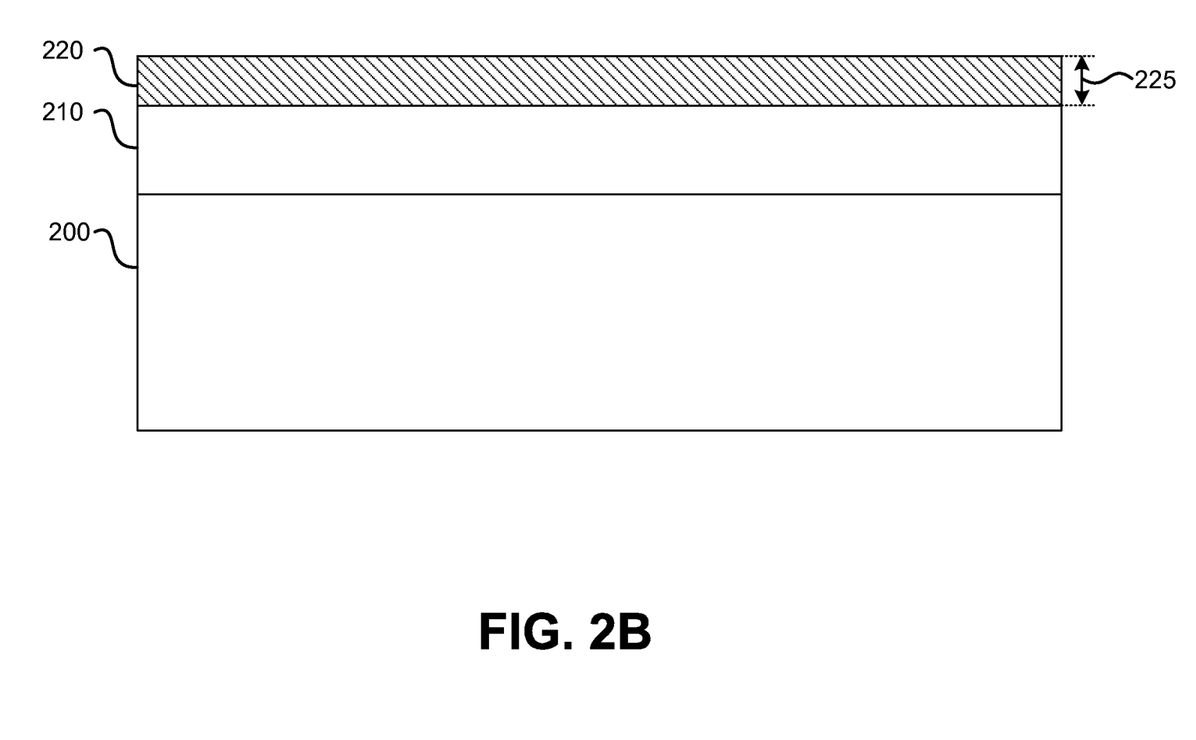

FIG. 2B illustrates the formation of a second GaN layer 220 coupled to the first GaN layer 210. The second GaN layer 220 has a conductivity type different than the first GaN layer 210, and therefore forms a p-n junction with the first GaN layer 210. For instance, if the first GaN layer 210 is formed from an n-type GaN material, the second GaN layer 220 will be formed from a p-type GaN material, and vice versa. In some embodiments, the second GaN layer 220 can also be used to form the edge termination structures. In such embodiments, the second GaN layer 220 can be a selective regrowth over portions of the first GaN layer 210, with other portions of the structure, characterized by reduced or no growth as a result of the presence of a regrowth mask (not shown). One of ordinary skill in the art would recognize many variations, modifications, and alternatives.

The thickness 225 of the second GaN layer 220 can vary, depending on the process used to form the layer and the device design. In some embodiments, the thickness 225 of the second GaN layer 220 is between 0.1 µm and 5 µm. In other embodiments, the thickness 225 of the second GaN layer 220 is between 0.3 µm and 1 µm.

The second GaN layer 220 can be relatively highly doped, for example in a range from about $5 \times 10^{17}$ cm$^{-3}$ to about $1 \times 10^{19}$ cm$^{-3}$. Additionally, as with other epitaxial layers, the dopant concentration of the second GaN layer 220 can be uniform or non-uniform as a function of thickness. In some embodiments, the dopant concentration increases with thickness, such that the dopant concentration is relatively low near the first GaN layer 210 and increases as the distance from the first GaN layer 210 increases. Such embodiments provide higher dopant concentrations at the top of the second GaN layer 220 where metal contacts can be subsequently formed. Other embodiments utilize heavily doped contact layers (not shown) to form Ohmic contacts.

One method of forming the layers described herein can be through a regrowth process that uses an in-situ etch and diffusion preparation processes. These preparation processes are described in U.S. patent application Ser. No. 13/198,666, filed Aug. 4, 2011, entitled "Method and System for Formation of P-N Junctions in Gallium Nitride Based Electronics," the entirety of which is hereby incorporated by reference.

Figure 2C:
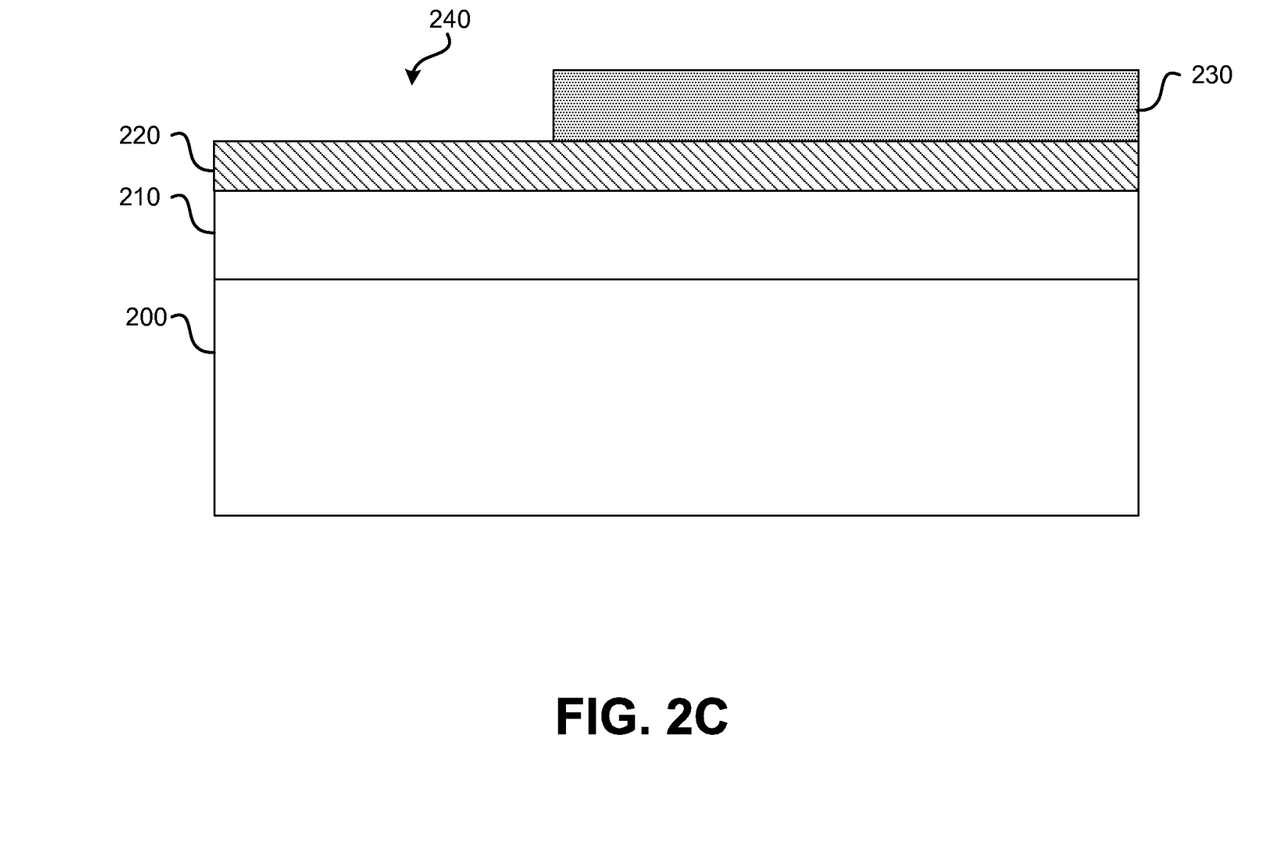
Figure 2D:
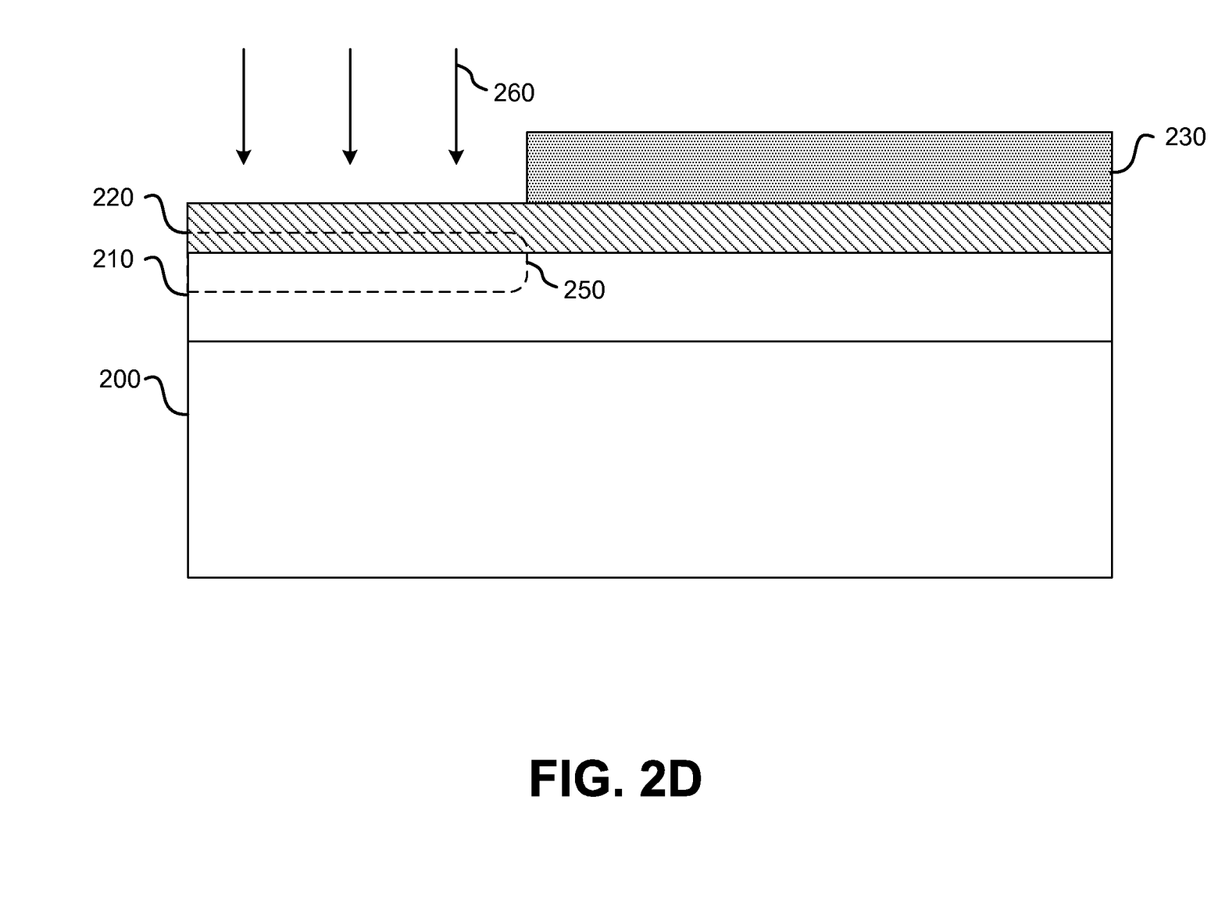

FIGS. 2C-2D illustrate the formation of a controlled breakdown region 250, lowering the breakdown voltage at a portion of the junction between the first GaN layer 210 and the second GaN layer 220. Referring to FIG. 2C, the controlled breakdown region 250 is defined by a mask 230, which blocks portions of the surface where the implant is not desired and has one or more openings 240 where the implant is allowed to pass. The mask may consist of photoresist, dielectric layers such as silicon oxide or silicon nitride metals such as Ni or Cr, or other materials, for example, or some combination thereof. The mask can be patterned using conventional methods to expose areas in which a controlled breakdown region 250 is desired. The mask can expose a portion of the p-n junction of the semiconductor device, for example, while covering edge termination regions and/or certain device regions. Although only one controlled breakdown region 250 is shown in the embodiment of FIGS. 2C-2D, a plurality of controlled breakdown regions 250 may be formed.

Referring to FIG. 2D, ion implantation is performed. Where the first GaN layer 210 has n-type conductivity, an n-type dopant, such as Si, is introduced into the GaN by ion implantation through the second GaN layer 220. In this process, the entire wafer surface is bombarded by Si ions 260, for example, accelerated at predetermined energies to achieve controlled doping depths and densities. The resulting n-type doping density at the p-n junction is higher than the background n-type doping of GaN layer 210. If the p-type doping of GaN layer 220 is substantially higher than the n-type doping of GaN layer 210, then the breakdown voltage of the p-n junction formed by these layers is determined mostly by the n-type doping of GaN layer 210. Thus, the additional n-type doping density introduced by Si implant 260 primarily determines the breakdown voltage of the controlled breakdown region 250. In an embodiment where the thickness 225 of the second GaN layer 220 is approximately 0.4 microns, the implantation energy can be approximately 400 keV. Other embodiments can utilize one or more implantation energies from 200 keV to 600 keV. Some embodiments can include implantation energies outside this range, depending on the thickness 225 of the second GaN layer 220, and/or other factors. Some embodiments may utilize additional or alternative doping processes. One of ordinary skill in the art would recognize many variations, modifications, and alternatives.

After Si ions are implanted into GaN layers 220 and 210, they can be annealed using a high temperature step to activate the implanted ions (i.e. allow the ions to interact with the GaN lattice such that they become electrically active). For example, the GaN substrate may be subjected to a high-temperature anneal using rapid thermal annealing (RTA), and furnace tube, or in an MOCVD reactor. Anneal temperatures in the range of 1000° C. to 1200° C. may be used, and the duration of the anneal may be from a few minutes to several hours. To mitigate possible decomposition of the GaN surface during the high temperature anneal, the anneal may be carried out in an ammonia-rich environment. Alternatively, or in addition, a cap layer may be formed on the GaN surface prior to the anneal. For example, a thin layer of aluminum nitride, aluminum-gallium nitride, silicon nitride, or similar films may be formed by MOCVD deposition prior to the Si implantation, the Si ions may be implanted through this cap layer and into GaN layers 220 and 210, and the cap layer may remain on the GaN surface during the activation anneal to stabilize the GaN surface and prevent decomposition.

The breakdown voltage of controlled breakdown region 250 can be set to help ensure breakdown occurs at the controlled breakdown region 250 at or before breakdown occurs at edges of the semiconductor device. For example, if a semiconductor device is expected to break down at approximately 90% of the parallel plane breakdown voltage, the controlled breakdown region 250 can be set at 80% of the parallel plane breakdown voltage. This would help ensure that breakdown current will, at least initially, flow through the controlled breakdown region 250 rather than at the edges. As voltage increases, breakdown current may flow at the edges and/or other locations of the semiconductor device. However, because doping of the controlled breakdown region 250 can set the breakdown voltage of the controlled breakdown region 250 accurately, breakdown of the semiconductor devices occurs in a more predictable manner than it would have if the semiconductor device had no controlled breakdown region 250.

FIGS. 2E-1 and 2E-2 illustrate embodiments of edge termination structures that may be used in conjunction with the vertical GaN diode of FIGS. 2A-2D.

Figure 2E:
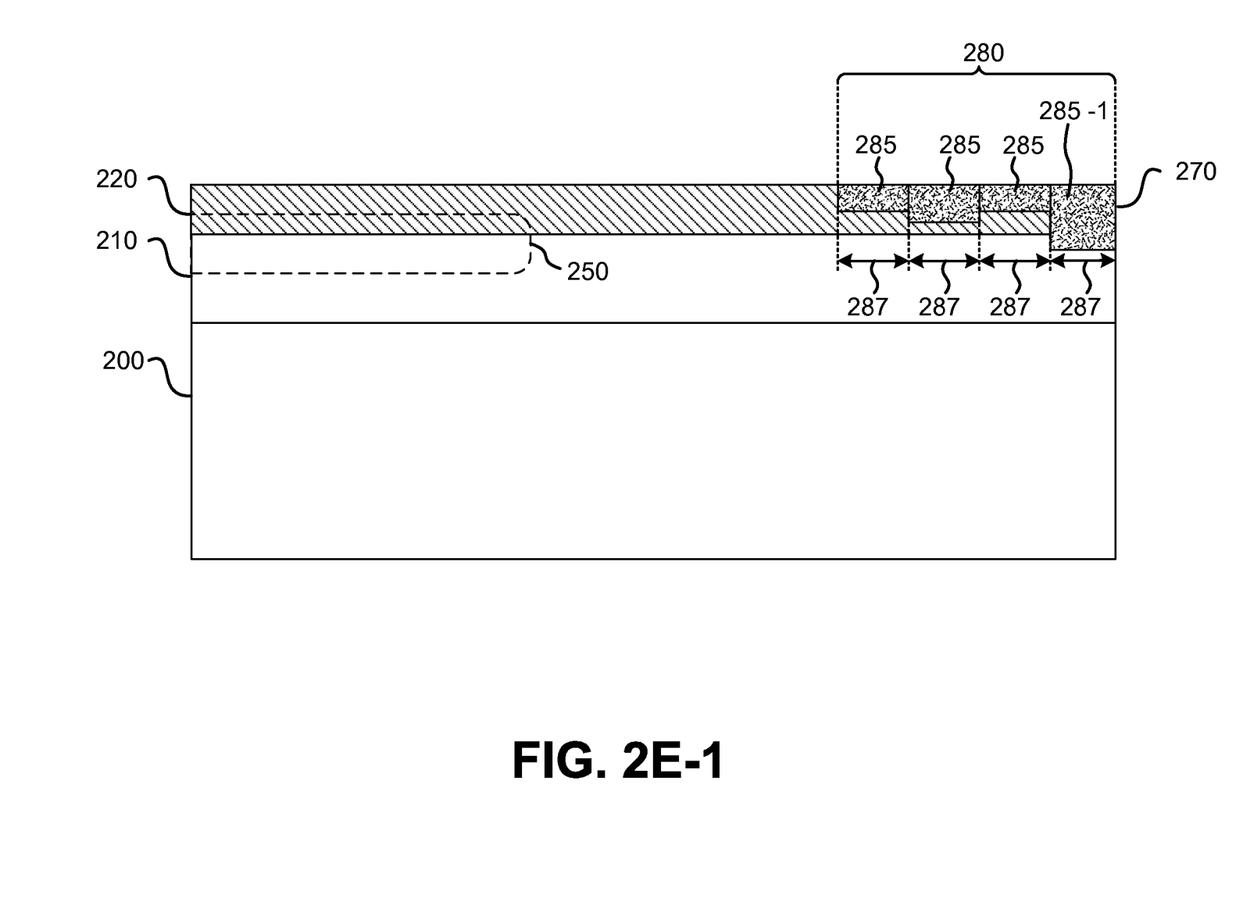

FIG. 2E-1 illustrates the formation of a junction termination region 280. In the embodiment shown, conductivity of the second GaN layer 220 and/or the first GaN layer 210 can be modified using an ion implantation process to create an edge termination region 270 in which the conductivity with respect to the unimplanted state is reduced. The conductivity of each of the first and second GaN layers 210, 220 is based, in part, on the active dopants or charge in the epitaxial layer times the thickness of the layer (i.e., the integrated charge in the layer). Ion implantation processes can be used to implant ionic species such as argon, nitrogen, helium, hydrogen and/or other appropriate species to increase the resistivity (i.e., decrease the conductivity) of predetermined portions of the epitaxial layer(s) to provide a spatial variation or modulation in the conductivity. Without limiting embodiments of the present invention, the inventors believe that the implantation process reduces the conductivity by at least one of the following mechanisms: compensating for dopants, annihilating dopants, increasing vacancy density, increasing void density, decreasing the total net charge in the epitaxial layer, decreasing the density of ionized acceptors (donors for n-type material), some or all of which may provide for increased resistivity. Due to the robust nature of GaN-based materials, ion implantation can produce implanted ions interspersed with unchanged epitaxial material, effectively reducing the conductivity in an averaged sense, with voids or vacancies interspersed in the lattice with as-grown epitaxial material. Embodiments are not limited by the physical mechanism resulting in the spatial conductivity modulation.

The lateral conductivity profile is a predetermined profile enabling device designers to achieve a breakdown at the edges of the semiconductor device much closer to the parallel plane breakdown voltage than otherwise achievable. Independent of the physical mechanism, a set of junction termination elements 285 can be characterized by differing active dopant densities or concentrations, with the outer junction termination elements having a lower active dopant density than inner junction termination elements. In some embodiments, an outermost junction termination element 285-1 can be an isolation element characterized by high resistivity and can be fabricated by ion implantation, etching, combinations thereof, or the like.

The widths 287 of the various junction termination elements 285 of the junction termination region 280 can also vary. According one embodiment, the width of the junction termination elements 285 of the junction termination region 280 range from 2 μm to 30 μm and can be approximately the same for all junction termination elements 285 of the junction termination region 280. In other embodiments, the widths vary among junction termination elements 285. In one embodiment, the depth and doping concentration associated with the junction termination elements 285 of the junction termination region 280 can also vary, which can be modulated by ion implantation energy and dose.

As an example, the implantation dose can vary between junction termination elements 285, thereby varying the conductivity of the elements. Additionally, in embodiments in which the implantation process is used as an alternative to an etch-based process, epitaxially grown surfaces are preserved, providing passivation benefits.

In another embodiment, the junction termination elements 285 with varying conductivity can be fabricated using one or multiple reduced charge layers, for example, with thicknesses varying from about 0.01 μm to about 5 μm. In another embodiment, spaces may be formed between junction termination elements 285, with the width between the elements increasing with distance from the semiconductor device, ranging, for example, from about 0.3 μm to about 6 μm. In other embodiments, other spacings are utilized as appropriate to the particular application.

Additionally or alternatively to junction termination elements 285, embodiments may include an junction termination region 280 with guard rings 288 that circumscribe all or a portion of a main device junction of the semiconductor device, as shown in FIG. 2E-2. The number of guard rings 288, as well as their spacing and voltage bias, can vary. Embodiments may, for example, include one to seven or more guard rings.

Figure 2E:
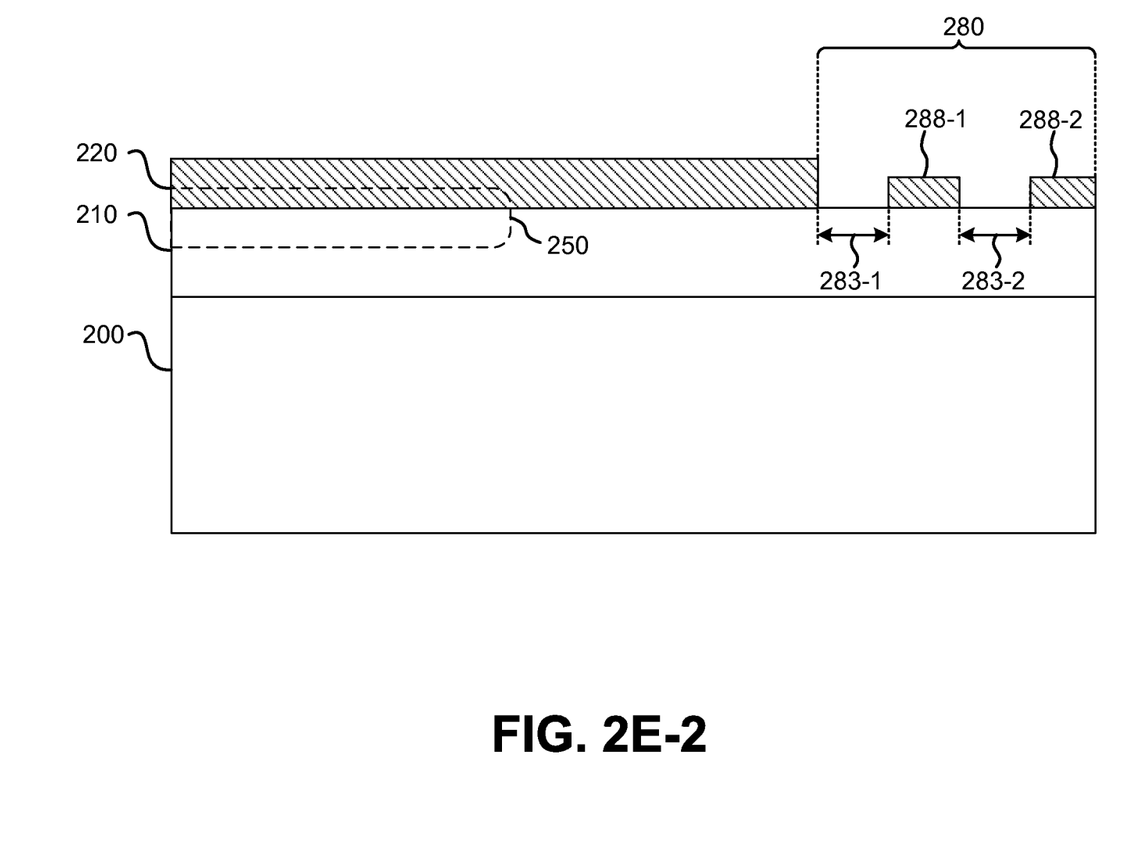

The number of guard rings 288 also can impact voltages at which each termination structure is biased. The voltage for each guard ring 288 can be decreased with each successive termination structure such that the termination structure farthest from the semiconductor device has the lowest voltage.

For example, if the second GaN layer 220 is biased at 600V and two guard rings are used, an inner guard ring 288-1 can float to 400V, and an outer guard ring 288-2 can float to and 200V. Of course, voltages can vary, depending on the physical dimensions and configuration of the semiconductor device and guard rings 288.

The spaces between the guard rings 288 can vary. According to some embodiments, width 283 of the spaces between edge guard rings 288 can increase as the distance from the semiconductor device increases. For example, as shown in the embodiment of FIG. 2E-2, the width 283-1 of a space between the inner guard ring 288-1 and the semiconductor device can be smaller than the width 283-2 of a space between the outer guard ring 288-1 and the inner guard ring 288-1. The width 283 of the spaces can vary depending on application. According one embodiment, the width of guard rings 288, ranging from 1 μm to 5 μm, can be approximately the same for all edge guard rings 288, and the widths 283 of spaces between edge guard rings 288 increases with increased distance from the semiconductor device, ranging anywhere from 0.5 μm to 6 μm. In other embodiments, other spacings are utilized as appropriate to the particular application.

Mesa etching, field plates, a junction-termination extension (JTE) region, deep trench termination, and/or a combination of these or other edge termination mechanisms can be utilized in addition or as an alternative to the edge-termination techniques discussed above in relation to FIGS. 2E-1 and 2E-2. Edge termination techniques are described in more detail in the following commonly assigned U.S. patent applications, which are incorporated by reference herein in their entirety:

U.S. patent application Ser. No. 13/305,165, filed Nov. 21, 2011, entitled "Edge Termination By Ion Implantation in GaN,"
U.S. patent application Ser. No. 13/270,606, filed Oct. 11, 2011, entitled "Method and System for Floating Guard Rings in GaN Materials,"
U.S. patent application Ser. No. 13/299,254, filed Nov. 17, 2011, entitled "Method and System for Fabricating Floating Guard Rings in GaN Materials," and
U.S. patent application Ser. No. 13/334,742, filed Dec. 22, 2011, entitled "Method and System for Junction Termination in GaN Materials using Conductivity Modulation."

The process shown in FIGS. 2A-2E are provided as an example only, and are not limiting. Furthermore, the figures are not drawn to scale, and the manufacture of the diode can include additional steps and/or features that are not shown. For example, an Ohmic metal contact may be created on the bottom of GaN substrate 200 to serve as an electrical contact to the cathode of the diode. The layers and/or structures described herein may include a number of sublayers, substructures, and/or other components to provide the functionality described herein. One of ordinary skill in the art would recognize many variations, modifications, and alternatives.

A controlled breakdown region 250 described in relation to FIGS. 2A-2D may be utilized in a variety of semiconductor devices utilizing a p-n junction.

Figure 3A:
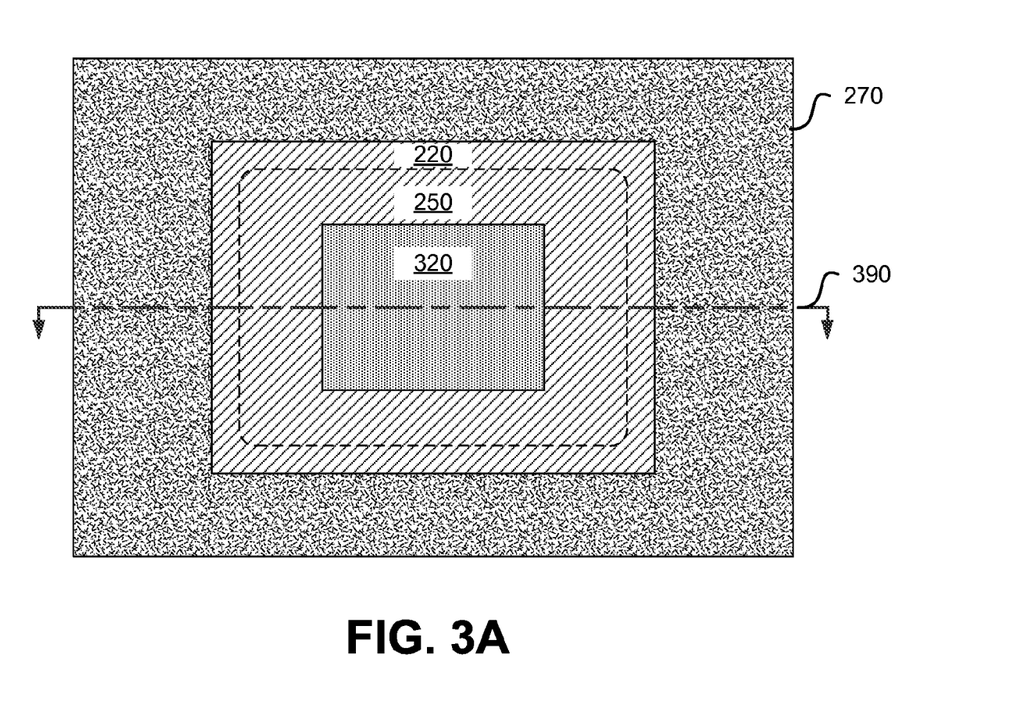
FIGS. 3A and 3B illustrate an embodiment of how a controlled breakdown region 250 can be utilized with a Schottky barrier diode.
Figure 3B:
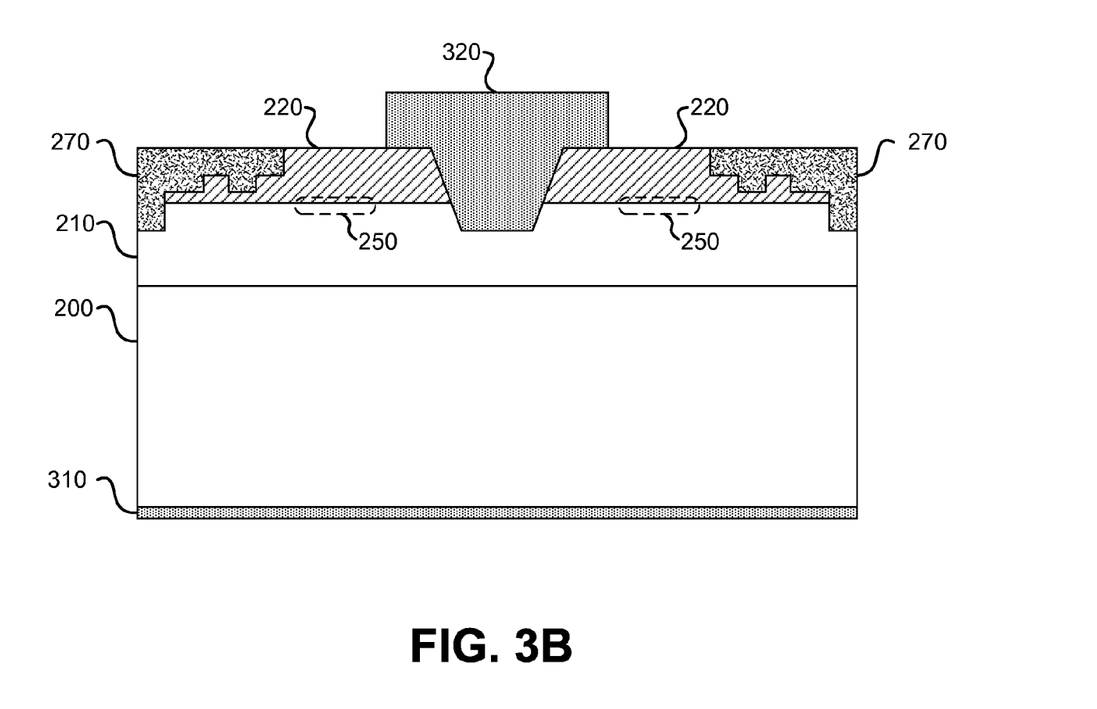

FIGS. 3A and 3B show how a controlled breakdown region 250 can be utilized with a Schottky barrier diode, according to one embodiment. FIG. 3A is an overhead view of the Schottky barrier diode, and FIG. 3B illustrates a corresponding cross-sectional view at a cross section 390. In this embodiment, the Schottky barrier diode includes a GaN substrate 200, first GaN layer 210, second GaN layer 220, and an edge termination region 270, which can include similar characteristics to corresponding structures previously described in relation to other embodiments.

As illustrated, a junction formed by the first GaN layer 210 and the second GaN layer 220 circumscribes a Schottky metal structure 320, which is coupled to the first GaN layer 210 and the second GaN layer 220. The Schottky metal structure 320 can comprise one or more layers of metal and/or alloys to create a Schottky barrier with the first GaN layer 210. The Schottky metal structure 320 further can be formed using a variety of techniques, including lift-off and/or deposition with subsequent etching, which can vary depending on the metals used. In some embodiments, a first layer of the Schottky metal structure 320 can include nickel, platinum, palladium, to make a good Schottky barrier with the P-type GaN layer 210, and additional layers of the Schottky metal structure 320 may be formed on top of the first layer to provide better contact. For example, layers of Ti, Ni, Pt, Al, Cu, Ag, Au, and/or other suitable metals may be used.

A portion of the junction formed by the first GaN layer 210 and the second GaN layer 220 includes the controlled breakdown region 250, which can also circumscribe the Schottky metal structure 320 (as shown in FIG. 3A). The controlled breakdown region 250 can improve the function of the Schottky barrier diode by helping ensure that breakdown occurs at the controlled breakdown region 250, rather than occurring under Schottky metal 320 or edge termination region 270. Thus controlled breakdown region 250 can provide a safe path for avalanche breakdown current to flow through the Schottky diode.

A metallic contact layer 310 can also be formed on a lower surface of the GaN substrate 200. The metallic contact layer 310 can be one or more layers of metal that serve as an Ohmic contact for the cathode of the Schottky diode. For example, the metallic contact layer 310 can comprise a titanium-aluminum (Ti/Al) Ohmic metal. Other metals and/or alloys can be used including, but not limited to, indium, gallium, aluminum, nickel, gold, silver, combinations thereof, or the like. In some embodiments, an outermost metal of the metallic contact layer 310 can include gold, silver, or aluminum, combinations thereof, and the like. The metallic contact layer 310 can be formed using any of a variety of methods such as sputtering, evaporation, or the like.

Figure 4A:
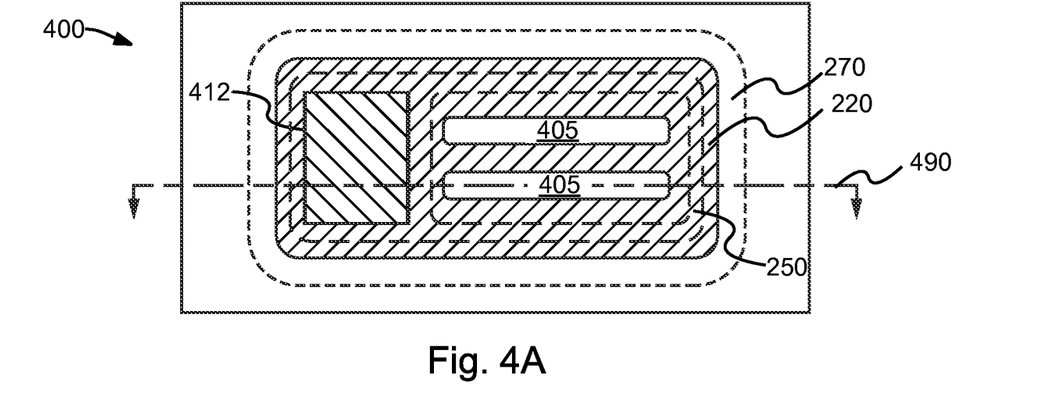
FIGS. 4A and 4B, illustrate an embodiment of how a controlled breakdown region 250 can be utilized with a JFET 400.
Figure 4B:
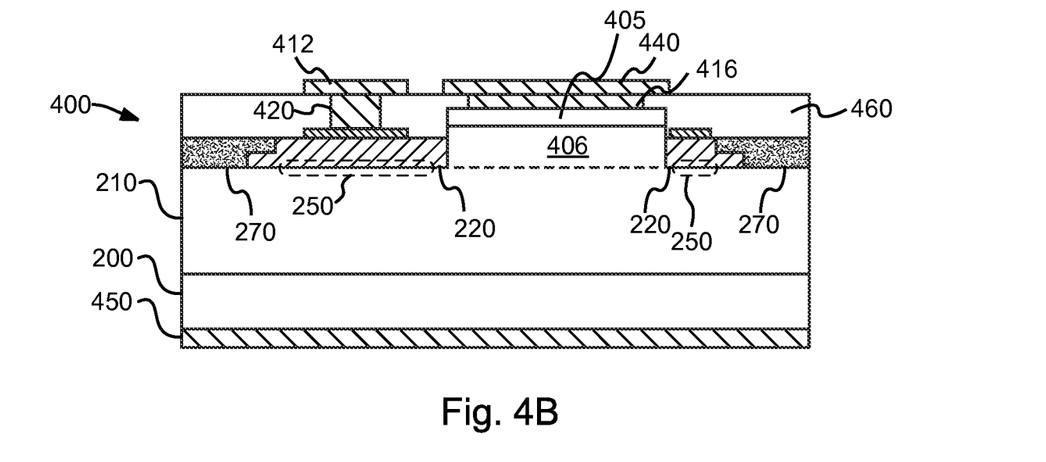

FIGS. 4A and 4B, show how a controlled breakdown region 250 can be utilized with a JFET 400, according to one embodiment. FIG. 4A is an overhead view of the JFET, and FIG. 4B illustrates a corresponding cross-sectional view at a cross section 490. In this embodiment, the JFET 400 includes a GaN substrate 200, first GaN layer 210, second GaN layer 220, and edge termination region 270, which can include similar characteristics to corresponding structures previously described in relation to other embodiments.

In the JFET 400, the second GaN layer 220 can form gate regions, which can be coupled to and completely surround each of one or more channel regions 406. As with GaN layers of other embodiments described herein, the dopant concentration of the second GaN layer 220 can be uniform or non-uniform as a function of thickness.

As illustrated in FIG. 4A, the gate region formed by the second GaN layer 220 can include a continuous region and one or more finger-like projections. The gate electrode 412 is disposed over the continuous region and coupled to the gate region via gate contacts 420. In some embodiments, the gate electrode 412 can include metals such as nickel, platinum, palladium, silver, gold, copper, etc., and alloys thereof. In some embodiments, the gate electrode 412 can be a multi-layered structure (e.g. a metal stack) comprising, for example, an adhesion layer such as titanium in contact with a relatively thick top metal layer, such as aluminum, gold, silver, or copper, which is suitable for attaching the gate electrode to a semiconductor package.

The first GaN layer 210 can be patterned and etched to form one or more channel regions 406. The channel region 406 can have a height of between 0.5 μm and 5 μm, a width of between 0.5 μm and 5 μm, and an n-type conductivity with a dopant concentration that is the same as or lower than the dopant concentration of the first GaN layer 210. Source regions 405 can be disposed on the top of channel regions 406. The source regions 405 may have the same conductivity type (e.g. n-type) as the channel regions 406 and the GaN substrate 200. The doping concentration of the source regions 405 may be substantially higher than the doping concentration of channel regions 406 in order to form a better Ohmic contact.

A source electrode 440 is coupled to the source regions 405 via source contacts 416. In some embodiments, the source electrode 440 can include metals such as titanium, aluminum, nickel, gold, etc. and alloys thereof. In some embodiments, the source electrode 440 can be a multi-layered structure comprising, for example, an contact layer such as titanium that provides a low-resistance Ohmic contact to source regions 405 and a relatively thick top metal layer, such as aluminum, gold, silver, or copper, which is suitable for attaching the source electrode to a semiconductor package.

An interlayer dielectric (ILD) layer 460 can be disposed over the second GaN layer 220 and/or edge termination region 270. One or more gate contacts 420 can be formed in the interlayer dielectric layer 460 to provide electrical connection between the second GaN layer 220 and the gate electrode 412. Likewise, one or more source contacts 416 can be formed in the interlayer dielectric layer 460 to provide electrical connection between the source regions 405 and the source electrode 440. The gate electrode 412 and source electrode 440 can be located such that the edge termination region 270 completely surrounds the gate electrode 412, thereby isolating the gate electrode 412 from the high voltage present on the portion of the first GaN layer 210 that lies outside of the edge termination region. Connections to external systems can be made via electrodes 440 and 412 using wire bonding, soldering, sintering, or other techniques. Additional or alternative edge termination techniques other than the edge termination region 270, such as those discussed previously in relation to other embodiments, may be used.

A drain electrode 450 can be coupled to an opposing surface of GaN substrate 200. In one embodiment, drain electrode 450 can be formed from indium, gallium, titanium, aluminum, nickel, gold, and/or similar materials to provide an Ohmic contact to GaN substrate 200. The drain electrode can be formed using any of a variety of methods such as sputtering, evaporation, or the like.

A portion of the junction formed by the first GaN layer 210 and the second GaN layer 220 can include a controlled breakdown region 250, which can also circumscribe the channel regions 406 (as shown in FIG. 4A). The controlled breakdown region 250 can improve the function of the JFET 100 by insuring that breakdown occurs at the controlled breakdown region 250, rather than occurring in channel regions 406 or edge termination region 270. Thus controlled breakdown region 250 provides a safe path for avalanche breakdown current to flow through the JFET.

Other features of the JFET 400 are described in relation to commonly-assigned U.S. patent application Ser. No. 13/675,694, filed Nov. 13, 2012, entitled "Vertical GaN JFET with Low Gate-Drain Capacitance and High Gate-Source Capacitance," which is hereby incorporated by reference herein in its entirety.

Figure 5:
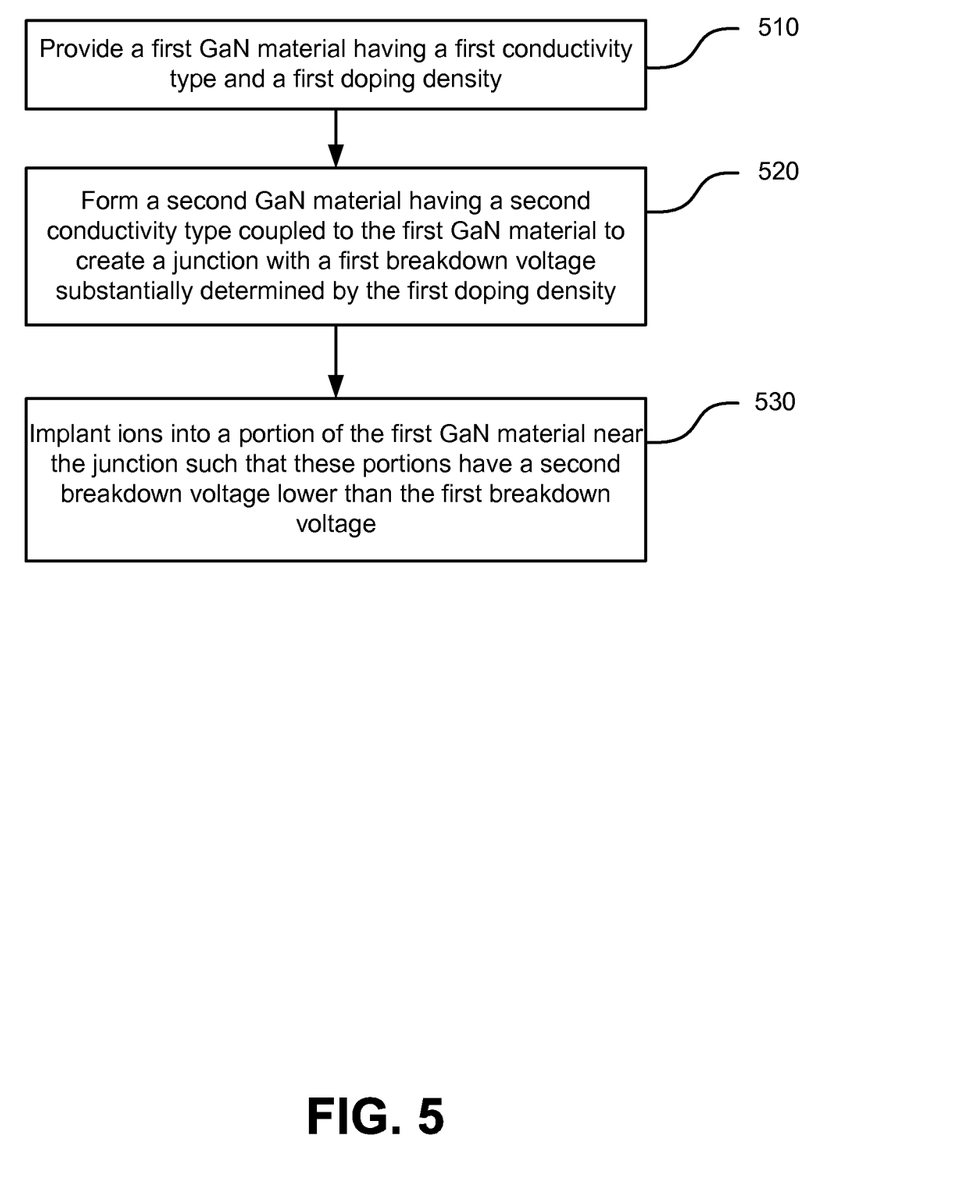
FIG. 5 is simplified flowchart illustrating an embodiment of a method of fabricating a vertical GaN power device.

FIG. 5 is simplified flowchart illustrating an example method of fabricating a vertical GaN power device, such as the diode, Schotty barrier diode, and/or the FET described in previous embodiments. The method can include providing a first GaN material having a first conductivity type and a first doping density (510). The first GaN material can comprise a first GaN layer provided on a GaN substrate with the same conductivity type. In some embodiments, for example, the first GaN material is an n-type GaN layer coupled to an n-type GaN substrate.

The method further includes forming a second GaN material having a second conductivity type coupled to the first GaN material to create a junction with a first breakdown voltage that is substantially determined by the doping density of the first GaN material (520).

The method further includes implanting ions through the second GaN material and into portions of the first GaN material, near the junction, such that these portions of the junction are characterized by a second breakdown voltage lower than to the first breakdown voltage (530). In some embodiments, for example, the junction is a p-n junction formed by an n-type first GaN material coupled to a p-type second GaN material. The portions of the junction characterized by a reduced breakdown voltage can be a controlled breakdown region as described above.

The difference in breakdown voltages can be due to differences in doping density of the first GaN material. For example, the first portion of the junction can be formed such that that a first dopant concentration of the first GaN material forming the first portion of the junction is higher than a second dopant concentration of the first GaN material forming the second portion of the junction. For embodiments in which the first GaN material comprises n-type GaN, the first portion of the junction can be implanted with silicon and/or other n-type dopants. The first portion of the junction can form part of a device region, separate from an edge termination region. Even so, the vertical GaN power device can optionally include one or more edge termination structures.

It should be appreciated that the specific steps illustrated in FIG. 5 provide a particular method of fabricating a fabricating a vertical GaN power device according to an embodiment of the present invention. Other sequences of steps may also be performed according to alternative embodiments. For example, alternative embodiments of the present invention may perform the steps outlined above in a different order. Moreover, the individual steps illustrated in FIG. 5 may include multiple sub-steps that may be performed in various sequences as appropriate to the individual step. Furthermore, additional steps may be added or removed depending on the particular applications. For example, some embodiments may provide for forming one or more edge termination structures by, for example, implanting ions into one or more GaN materials or structures. One of ordinary skill in the art would recognize many variations, modifications, and alternatives.

Furthermore, although embodiments provided above are discussed in terms of GaN substrates and GaN epitaxial layers, the present invention is not limited to these particular binary III-V materials and is applicable to a broader class of III-V materials, in particular III-nitride materials. Additionally, although a GaN substrate is illustrated in FIGS. 2A-2E, embodiments of the present invention are not limited to GaN substrates. Other III-V materials, in particular, III-nitride materials, are included within the scope of the present invention and can be substituted not only for the illustrated GaN substrate, but also for other GaN-based layers and structures described herein. As examples, binary III-V (e.g., III-nitride) materials, ternary III-V (e.g., III-nitride) materials such as InGaN and AlGaN, quaternary III-nitride materials, such as AlInGaN, doped versions of these materials, and the like are included within the scope of the present invention.

Additionally, although embodiments provided describe an n-type drift layer (e.g., first GaN layer 210) that can be grown on top of an n-type substrate, present invention is not limited to this particular configuration. In other embodiments, substrates with p-type doping can be utilized. Additionally, embodiments can use materials having an opposite conductivity type to provide devices with different functionality. Thus, although some embodiments described herein include n-type GaN epitaxial layer(s) doped with silicon, in other embodiments highly or lightly doped material, p-type material, material doped with dopants in addition to or other than silicon such as Mg, Ca, Be, Ge, Se, S, O, Te, and the like can also be used. The substrates discussed herein can include a single material system or multiple material systems including composite structures of multiple layers. One of ordinary skill in the art would recognize many variations, modifications, and alternatives.

It is also understood that the examples and embodiments described herein are for illustrative purposes only and that various modifications or changes in light thereof will be suggested to persons skilled in the art and are to be included within the spirit and purview of this application and scope of the appended claims.

What is claimed is:

1. A method for fabricating a vertical GaN power device, the method comprising:
   providing a first GaN material having a first conductivity type;
   forming a second GaN material having a second conductivity type and coupled to the first GaN material to create a p-n junction; and
   implanting ions through the second GaN material and into a first portion of the first GaN material to form an implanted region extending from within the first GaN material across the p-n junction into the second GaN material, wherein the implanted region spans a first portion of the p-n junction, such that the p-n junction extends from within the implanted region across a boundary of the implanted region into a second portion of the p-n junction,
   wherein the first portion of the p-n junction has a breakdown voltage which is less than a breakdown voltage of the second portion of the p-n junction.

2. The method of claim 1, further comprising forming the first portion of the p-n junction such that the second portion of the p-n junction is between an edge of the p-n junction and the first portion of the p-n junction.

3. The method of claim 1, wherein the first conductivity type is n-type.

4. The method of claim 3, wherein with the implanted ions comprise silicon.

5. The method of claim 1, wherein the vertical GaN power device comprises a diode.

6. The method of claim 5, wherein the diode comprises a Schottky barrier diode.

7. The method of claim 1, wherein the vertical GaN power device comprises a junction field-effect transistor (JFET).

8. The method of claim 1, wherein a first dopant concentration of the first GaN material in the implanted region is higher than a second dopant concentration of the first GaN material in the second portion of the p-n junction.

9. The method of claim 1, further comprising forming one or more edge termination structures.

10. The method of claim 9, wherein at least one of the termination structures comprises a junction termination region comprising
    a plurality of junction termination elements, each having a different dopant density.

11. The method of claim 10, wherein those junction termination elements closer to the implanted region have a higher dopant density than those junction termination elements farther from the implanted region.

12. The method of claim 10, further comprising forming an isolation element in the edge termination structure.

13. The method of claim 12, wherein the junction termination elements are between the isolation element and the implanted region.

14. The method of claim 9, wherein at least one of the termination structures comprises a junction termination region comprising a guard ring at least partially circumscribing the p-n junction.

* * * * *